United States Patent [19]

Josowicz et al.

[11] Patent Number: 5,022,969

[45] Date of Patent: Jun. 11, 1991

[54] PROCESS FOR ENCASING AN ELECTRONIC COMPONENT

[76] Inventors: Mira Josowicz, Robert-Koch-Str. 20; Karin Potje-Kamloth, Rathaus-Str. 2, both of 8012 Ottobrunn, Fed. Rep. of Germany

[21] Appl. No.: 353,072

[22] Filed: May 15, 1989

[30] Foreign Application Priority Data

May 13, 1988 [DE] Fed. Rep. of Germany ....... 3816457

[51] Int. Cl.$^5$ .............................................. C25D 11/00
[52] U.S. Cl. ................................... 204/56.1; 204/58.5
[58] Field of Search ..................... 204/14.1, 56.1, 58.5

[56] References Cited

U.S. PATENT DOCUMENTS

| | | | |
|---|---|---|---|
| 2,961,384 | 11/1960 | McKinney et al. | 204/58.5 |
| 3,335,075 | 8/1967 | Borman | 204/14.1 |
| 4,070,258 | 1/1978 | McGinniss | 204/14.1 |
| 4,231,851 | 11/1980 | Mengoli et al. | 204/58.5 |
| 4,369,290 | 1/1983 | Evans et al. | 204/14.1 |
| 4,444,627 | 4/1984 | Liau et al. | 204/58.5 |

FOREIGN PATENT DOCUMENTS 0229922 11/1985 Japan ................................. 204/58.5

Primary Examiner—John F. Niebling
Assistant Examiner—Steven P. Marquis
Attorney, Agent, or Firm—Michael J. Striker

[57] ABSTRACT

The process for encasing an electrically conductive region in an electronic component in an insulating layer comprises the steps of depositing a polymer layer by electrochemical polymerization of phenol-, thiophenol- and analine-containing monomers and their combinations from an electrolytic solution on the electrically conductive region and subsequently cross-linking the polymer layer to form a chemically inert insulating layer. The process provides a uniformly adhering thin insulating layer. A field effect transistor so encased is suitable for use as a physical and/or chemical sensor.

20 Claims, 2 Drawing Sheets

☐ UNINSULATED REGIONS
▨ INSULATED REGIONS

PROCESS FOR ENCASING AN ELECTRONIC COMPONENT

BACKGROUND OF THE INVENTION

Our invention relates to a process for encasing and/or insulating the electrically conducting regions of an electronic component, e.g. a Field effect transistor or diode.

The encasing of the electrically conductive regions of an electronic component is necessary so that the electronic component is protected from corrosion during operation. For example in a chemically sensitive Field effect transistor it is important so that it remains operational in an electrolytic solution. That the encasing material has a low permeability for water or electrolyte, good adherence properties and good mechanical properties are requirements for the encasing or insulating material.

The encasing of the chemically sensitive Field effect transistor is described in the Literature in "Solid State Chemical Sensors", by Jiri Janata and Robert J. Huber, Academic Press, Inc., New York(1985), pp. 153-157. Silicone rubber and Epoxy resin can be used as encasing materials. This encasing occurs manually, which is especially difficult in the gating region, which must be free of insulating material. To eliminate this difficulty, one must modify the still not hardened encased material, especially the rheological properties.

SUMMARY OF THE INVENTION

Accordingly, it is an object of our invention to provide a process for encasing an electrically conducting region in an electronic component, which can be performed with a higher accuracy and productivity and leads to a more uniformly adhering insulating layer which has a higher breakdown voltage and is chemically more inert.

In keeping with this object and with others which will become apparent hereinafter, our process comprises the steps of depositing a polymer layer by electrochemical polymerization of phenol-, thiophenol- and analine-containing monomers from an electrolytic solution on the electrically conductive regions and subsequently cross-linking that polymer layer to form a chemically inert insulating layer.

Several embodiments of our invention are possible. The polymer layer can be built up from linear polymer chains. Advantageously the phenyl group of the monomer contains an aliphatic group in the ortho position. However the phenyl group of the monomer from which the polymer layer is built contains an unsaturated aliphatic group with 2 to 10 carbon atoms, particularly in the ortho position.

The electrically conducting regions of the electronic component, which should be insulated, are connected by bonding wire and are connected to a wire for current flow to be used as an anode.

Advantageously the electrochemical deposition can occur in aqueous alkaline media. The electrolyte solution contains an amine, which is advantageously a primary amine having an aliphatic group. The electrolyte solution contains an adhesion promoting agent.

In the process according to our invention the cross-linking of the polymeric layer can occur by heating or by irradiating. A passive layer can be removed by cleaning. The electrochemical deposition can occur at 20° to 50° C. The cross-linking by heating can occur at temperatures of from 120° to 200° C. The insulating layer is applied with a layer thickness of 1.0 to 20 micrometers. Other electrically conductive regions, which are not to be insulated, may be formed by a metal, which easily forms a thin passive oxide layer. These metals may be selected from the group consisting of titanium, tungsten, tantalum, aluminum, molybdenum and alloys thereof. Other electrically conductive regions, which are not to be insulated, can be protected by a galvanic resist prior to electrochemical deposition.

Our invention also comprises chemical and physical sensors which are made from the above-described electronic components.

Because of the electrochemical structure of the insulating layer a very thin uniform layer is applied to the electrically conducting regions which are to be insulated. Only those regions which are to be insulated or encased, are to be protected by simple electrical contact. Our process allows an automatic manufacture with a high production rate and good reproducibility. The insulating layers are very strongly adhering and chemically inert.

The use of poly-4-oxyphenylene as a corrosion protecting layer is described in the Literature in J. Electrochem. Soc., Electrochemical Science and Technology, (1981), pp. 2276-2281. Such corrosion protection layers exhibit good properties, especially corrosion resistance, with a layer thickness of at least 10 micrometers. It is also reported that the layers with a thickness of only 1 to 2 micrometers exhibit either an improved metal protection or advantages in hardening or cross-linking. The use of poly-4-oxyphenylene layers as insulating material for encasing of electrically conducting regions in an electronic component is not reported.

BRIEF DESCRIPTION OF THE DRAWING

The objects, features and advantages of our invention will be made more apparent from the following detailed description, reference being made to the accompanying drawing in which.

DETAILED DESCRIPTION OF THE INVENTION

Figure 1:
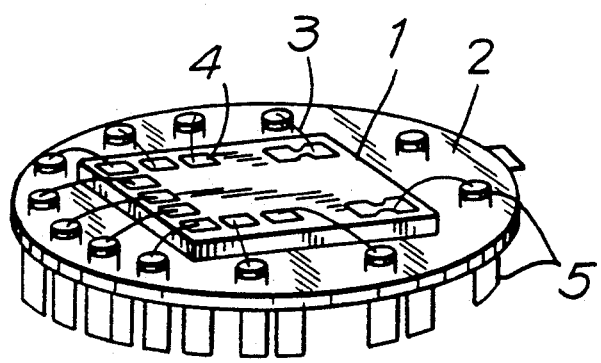
FIG. 1 is a perspective view of an unencased electronic component, specifically a Field effect transistor.

FIG. 1 shows a transistor chip 1, which is contacted on its rear side with a transistor housing 2. The pins 5 are connected electrically with the contacts of the transistor 4 by a bonding wire 3.

Figure 3:
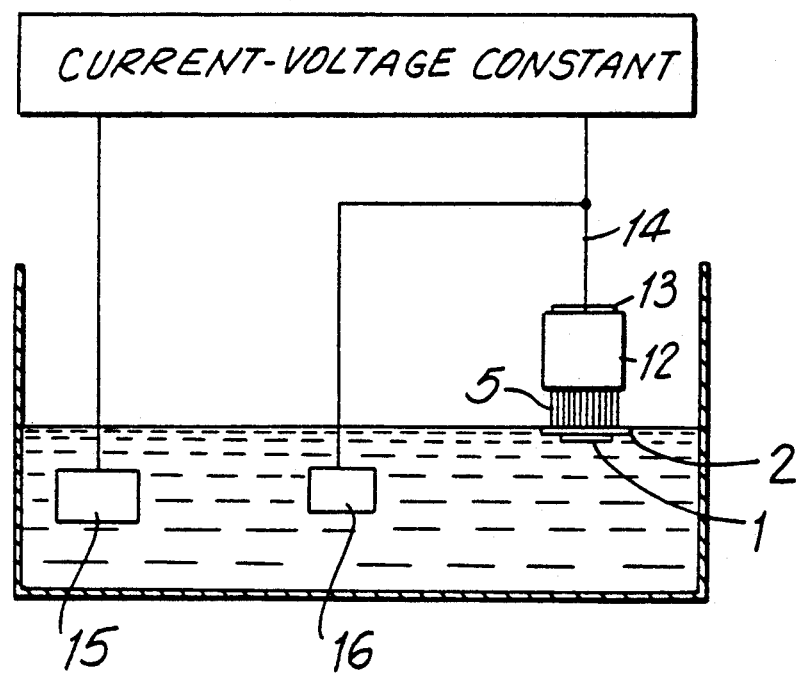
FIG. 3 is a schematic diagram of an apparatus for encasing by electrochemical deposition.

To perform the deposition the electronic component shown in FIG. 1 is plugged into a transistor socket 12, according to the structure of the socket in FIG. 3. The conductors 13 of the transistor socket 12 are soldered to each other so that in all regions of the electronic component, which should be insulated, an electrical contact is made. The conductors 13 of the transistor socket 12 electrically connected with each other are electrically connected with a wire provided for current flow.

The entire unit is used as a working electrode and contacted by a constant current/voltage source with two metal electrodes 15 and 16. The electrode 15 is made of a Noble metal, for example Platinum. The metal electrode 16 is contacted parallel with the working electrode. The metal electrode 16 has the function of a ballast electrode and is used for determining the thickness of the insulating layer, which occurs by observation of the deposition rate. (Measurement with a profilometer). Materials, which are advantageously used in making the bonding contacts 4 on the transistor chip 1, are used as the metal of the ballast electrode.

The working electrode, on which a polymer layer is formed by electrochemical polymerization of phenol-, thiophenol- and/or aniline-containing monomers, is immersed in an electrochemical bath. The electrochemically-formed polymer layer is made of linear polymer chains. So that linear polymer chains can be formed, the phenyl group of the monomer has an aliphatic group in the ortho- position, which contains up to 10 carbon atoms, advantageously 5 carbon atoms or less. The phenyl group of the monomer has at least one unsaturated alpihatic group with two to ten carbon atoms, advantageously 2 to 5 carbon atoms, which is present especially at the ortho-position. Suitable monomers include the 2-allyl phenol, 2-allyl thiophenol and 2-allyl aniline and/or appropriate vinyl compounds. Monomers with a saturated alpihatic group like cresol can be used as a comonomer besides the unsaturated monomer up to a proportion of 20 Mol %.

A linear polymer formed advantageously in the electrochemical deposition has the following structure:

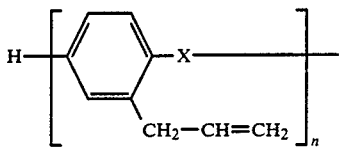

WHERE X = O, S, —NH

The electrochemical deposition occurs advantageously in an aqueous, alkaline media at the anode. Advantageously a water-alcohol-mixture is used, which has a mixture ratio of 1:10 to 10:1 by volume, advantageously 1:5 to 5:1 by volume. The electrolyte contains an amine besides the monomer to suppress the passivation of the electrode surface. Advantageously the amine is a primary amine group with an unsaturated aliphatic group. Advantageously the amine can be allyl amine and propyl amine.

Advantageously the electrolyte solution contains an adhesion promoting agent, to promote the adherence of the insulating layer on the electrical regions to be insulated. Ethylene glycol monobutyl ether and butoxymethanol are suitable adhesion promoting agents. the adhesion promoting agent is used in a proportion of 1 to 10 volume % of the electrolyte solution.

The polymer layer deposited on the electrically conducting portion or regions is insoluble in an aqueous system, although it can be dissolved in various organic solvents. So that a firmly adhering insulating layer is formed, the polymer layer must be cross-linked by the unsaturated groups. The cross-linking of the unsaturated groups occurs by heating or irradiating(e.g. UV-radiation). Advantageously after deposition of the polymer layer a thermal treatment, advantageously at 120° to 200° C., especially at 150° C., is performed. The housing with the electronic component without the transistor socket 12, as is illustrated in FIG. 3, is heated in an oven at 150° C. for 30 minutes. The deposited polymer layer is transformed into an insulator by the cross-linking.

So that a good adherence between the insulating layer and the electrically conducting region is guaranteed, it is advantageous to etch chemically and/or electrochemically the electrically conducting regions or portions prior to deposition of the polymer layer to eventually remove the passive layers present. A suitable process occurs in an electrochemical etching with a solution of ethylene diamine tetraacetate, ammonia and hydrogen peroxide with a pulsating voltage of 0 to +2V for a time interval of 5 to 10 minutes. Subsequently a voltage of +0.4 to −0.4V is applied to the electrode for 10 minutes in a 1M $KNO_3$ solution.

The electrochemical polymerization occurs advantageously in moving electrolyte, advantageously in a flow cell, since it improves the deposition because of diffusion of the monomer to the electrode. Alternatively or additionally the deposition can also advantageously be performed under a partial vacuum. The electrochemical polymerization occurs at 20° to 50° C., advantageously at room temperature. It operates at constant potential, advantageously from 2 to 8V, especially from 4 to 6V.

The insulating layer applied to the electrically conducting regions or portions has a thickness of 1.0 to 20 micrometers, advantageously 1 to 8 micrometers. It has been found that an insulating layer with such a layer thickness has good adherence and provides the desired insulating effect.

According to one advantageous embodiment regions or portions, which should not be electrically insulated, are formed by metals, which easily form passive oxide coatings. These metals include such metals as titanium, tungsten, tantalum, aluminum, molybdenum or an alloy thereof.

The electrically conducting regions, which are not insulated, may be protected by a galvanic resist prior to the electrochemical deposition. Suitable galvanic resists are obtainable commercially.

Figure 2:
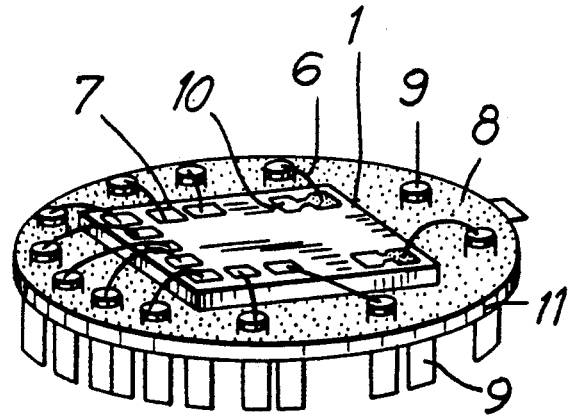
FIG. 2 is a perspective view of an electronic component of FIG. 1 encased according to the process of our invention.

An advantageous encased structural component is shown schematically in FIG. 2. As is apparent in FIG. 2, the shaded region shows the insulated region such as the contacting wire 6, the bonding contacts of the transistors 7 and the housing 8, on which the electronic component is mounted. The uncontacted pins of the housing 9, which were dipped in the electrolyte and the other pins 11, which were not dipped in the electrolyte and also the partially covered regions of the bonding contacts 10(e.g. with a galvanic resist) are not coated and naturally are not insulated.

The electronic component encased in the form of the Field effect transistor chip shown in FIG. 1 can be used as a chemical and/or physical sensor. Physically or chemically sensitive layers, advantageously hydrogen-sensitive palladium layers, are applied in the gate region of the transistor.

Our invention is illustrated in detail by the following example.

EXAMPLE

A Field effect transistor shown in FIG. 1 was encased. The encasing scheme shown in FIG. 3 was used. The working electrode assembled according to FIG. 3 was coated anodically in an electrolytic solution, which contained the following components:

| | |
|---|---|
| 0.23 Mol/l | 2-allyl phenol |

| | |
|---|---|
| 0.40 Mol/l | Allyl amine |
| 0.20 Mol/l | Cellusolve (Ethylene glycol monobutyl ether) |

The components were dissolved in a mixture of methanol and water(volume ratio 1:1).

The electrochemical polymerization was performed at a constant potential of 4V at a room temperature for 30 minutes. After deposition of polymer the housing with the electronic component without the transistor socket as shown in FIG. 3 is heated in an oven at 150° C. for 30 minutes so that a cross-linking of the deposited polymer to form an insulating layer occurs. The encapsulated regions or portions of the Field effect transistor layer are shown in FIG. 2. The insulating layer formed on the electrically conducting region has a uniform layer thickness of 1.5 micrometers. The layer thickness was very adherent and chemically inert in the usual electrolytic solution. The encapsulated Field effect transistor can be used again for a chemical or physical sensor.

It is to be understood that each of the elements described above, or two or more together, may also find a useful application in other types of constructions differing from the types described above.

While the invention has been illustrated and described as embodied in a process for encasing an electrically conductive region or portion in an electronic component, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of the prior art, fairly constitute essential characteristics of the generic or specific aspects of this invention.

What is claimed as new and desired to be protected by Letters Patent is set forth in the appended claims.

What is claimed is:

1. A process for encasing an electrically conductive region in an electronic component in an insulating layer comprises the steps of:
   a. depositing a polymer layer on said electrically conductive region by electrochemical polymerization of a single monomer selected from the group consisting of substituted phenol-, thiophenol- and aniline-containing monomers, from an electrolytic solution; and
   b. subsequently self cross-linking said polymer layer by one of heating and irradiating to form a chemically inert insulating layer.

2. A process according to claim 1 further comprising making said polymer layer from a plurality of linear polymer chains.

3. A process according to claim 1 wherein said monomer has a phenyl group containing an aliphatic group at an ortho position thereof.

4. A process according to claim 1 wherein said monomer has a phenyl group containing at least one unsaturated aliphatic group having 2 to 10 carbon atoms.

5. A process according to claim 4 wherein said unsaturated aliphatic group is attached to said phenyl group in an ortho position.

6. A process according to claim 1 further comprising connecting such electrically conducting regions of said electrical component, which should be insulated, by bonding wire and also connecting such regions by a current-carrying wire as an anode.

7. A process according to claim 1 further comprising performing said depositing in an aqueous alkaline media.

8. A process according to claim 1 wherein said electrolytic solution contains an amine.

9. A process according to claim 8 wherein said amine is a primary amine with an aliphatic group.

10. A process according to claim 1 said wherein said electrolytic solution contains an adherence promoting agent.

11. A process according to claim 1 further comprising performing said cross-linking of said polymer layer by heating.

12. A process according to claim 1 further comprising performing said cross-linking of said polymer layer by irradiating.

13. A process according to claim 1 further comprising cleaning said electronically conducting regions chemically prior to said depositing to remove a passive layer.

14. A process according to claim 1 further comprising cleaning said electronically conducting regions electrochemically prior to said depositing to remove a passive layer.

15. A process according to claim 1 further comprising performing said depositing at 20° to 50° C.

16. A process according to claim 1 further comprising performing said cross-linking at a temperature of 120° to 200° C.

17. A process according to claim 1 further comprising applying said insulating layer in a thickness of 1.0 to 20 micrometers.

18. A process according to claim 1 further comprising forming another electrically conducting region, which should not be insulated, by a metal which easily forms a passive oxide layer.

19. A process according to claim 1 wherein said metal which easily forms said passive oxide layer is an element selected from the group consisting of titanium, tungsten, tantalum, aluminum, molybdenum and alloys thereof.

20. A process according to claim 1 further comprising protecting another electrically conducting region, which should not be insulated, by a galvanic resist prior to said depositing.

* * * * *